United States Patent
Yen et al.

(10) Patent No.: US 7,781,783 B2
(45) Date of Patent: Aug. 24, 2010

(54) WHITE LIGHT LED DEVICE

(75) Inventors: Jui-Kang Yen, Taipei (TW); Yung-Wei Chen, Taichung (TW)

(73) Assignee: SemiLEDs Optoelectronics Co., Ltd., Chu-Nan (TW)

( * ) Notice: Subject to any disclaimer, the term of this patent is extended or adjusted under 35 U.S.C. 154(b) by 333 days.

(21) Appl. No.: 12/025,584

(22) Filed: Feb. 4, 2008

(65) Prior Publication Data

US 2008/0203414 A1    Aug. 28, 2008

Related U.S. Application Data

(60) Provisional application No. 60/888,709, filed on Feb. 7, 2007.

(51) Int. Cl.
*H01L 29/22* (2006.01)

(52) U.S. Cl. .............................. 257/89; 257/98; 257/99; 257/100; 257/E33.061; 257/E33.074

(58) Field of Classification Search .................... 257/89, 257/98, 99, 100, E33.061, E33.074; 313/501, 313/502, 503
See application file for complete search history.

(56) References Cited

U.S. PATENT DOCUMENTS

| | | | |
|---|---|---|---|
| 5,959,316 | A | 9/1999 | Lowery |
| 5,998,925 | A | 12/1999 | Shimizu et al. |
| 7,329,907 | B2 * | 2/2008 | Pang et al. ............. 257/99 |
| 2002/0190262 | A1 | 12/2002 | Nitta et al. |
| 2006/0099449 | A1 * | 5/2006 | Amano et al. ......... 428/690 |
| 2008/0210961 | A1 * | 9/2008 | Lin et al. ............... 257/98 |

* cited by examiner

*Primary Examiner*—Minh-Loan T Tran
(74) *Attorney, Agent, or Firm*—Patterson & Sheridan, LLP (57) ABSTRACT

Light-emitting diode (LED) devices which can produce a uniform white light with a broad emission spectrum and a high color rendering index (CRI) are provided. For example, the emission spectrum of LED devices as described herein may provide more red light and yield a higher CRI light when compared to conventional white LEDs. For some embodiments, the various lights emitted from different layers of the LED device may mix at a light-scattering encapsulation layer and become a uniform white light.

20 Claims, 7 Drawing Sheets

WHITE LIGHT LED DEVICE

CROSS-REFERENCE TO RELATED APPLICATIONS

This application claims benefit of U.S. Provisional Patent Application Ser. No. 60/888,709 filed Feb. 7, 2007, which is herein incorporated by reference.

FIELD OF THE INVENTION

Embodiments of the present invention relate to the field of lighting with light-emitting diodes (LEDs) and, more particularly, to LED devices for producing uniform white light having a broad emission spectrum and a high color rendering index (CRI).

BACKGROUND OF THE INVENTION

Figure 1:
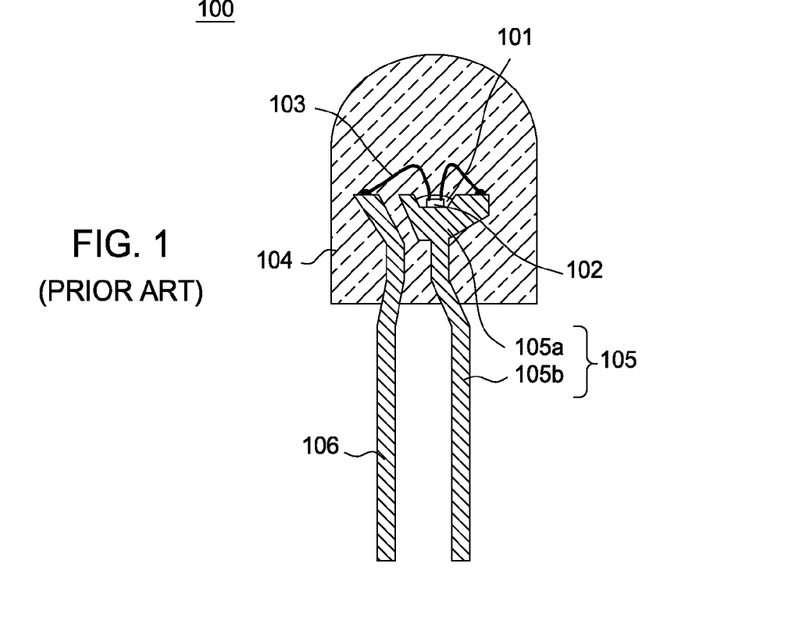
FIG. 1 is a prior art cross-sectional view of a light-emitting diode (LED) device having a blue LED die encapsulated by a yellow phosphor layer.

To produce white light from a solid state device, designers have tried encapsulating blue LEDs with a yellow fluorescent layer. For example, U.S. Pat. No. 5,998,925 to Shimizu et al., issued Dec. 7, 1999 and entitled "Light Emitting Device Having a Nitride Compound Semiconductor and a Phosphor Containing a Garnet Fluorescent Material," teaches such a light-emitting diode 100 as illustrated in FIG. 1. LED 100 is a through-hole light-emitting diode having a mount lead 105 and an inner lead 106, wherein a light-emitting component 102 is installed on a cup 105a of the mount lead 105, and the cup 105a is filled with a coating resin 101 which contains a specified phosphor to cover the light-emitting component 102. An n-electrode and a p-electrode of the light-emitting component 102 are connected to the mount lead 105 and the inner lead 106, respectively, by means of wires 103.

When the LED 100 is forward-biased, a portion of the light emitted by the light-emitting component 102 stimulates the phosphor contained in the coating resin 101 to generate fluorescent light having a wavelength different from that of the LED light. In this manner, the fluorescent light emitted by the phosphor and the LED light that is output without contributing to the excitation of the phosphor are mixed and output. This combination of blue light and yellow light produces what may be considered as white light.

However, the white light produced by the LED 100, as well as other similar devices, typically has a core of white light surrounded by an inner ring of blue light, which is further encircled by an outer ring of yellow light. The reason for the color ring may be seen in the emission spectrum 200 of FIG. 2 for LED 100. The emission spectrum 200 portrays that emission energy above 40% exists only in a narrow wavelength band ranging from about 440 nm to 475 nm (i.e., blue light). Furthermore, the emission spectrum 200 exhibits two distinct peaks (one for blue light and one for yellow light at approximately 570 nm) and does not match a typical emission spectrum for white light, which has approximately uniform energy in a wavelength band extending from about 400 to 600 nm.

Figure 3A:
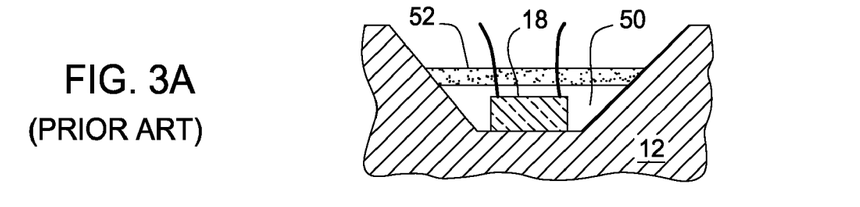
FIGS. 3A and 3B are prior art cross-sectional diagrams of LED devices having a blue LED dies surrounded by a transparent encapsulate and a phosphor layer disposed above the transparent encapsulate.
Figure 3B:
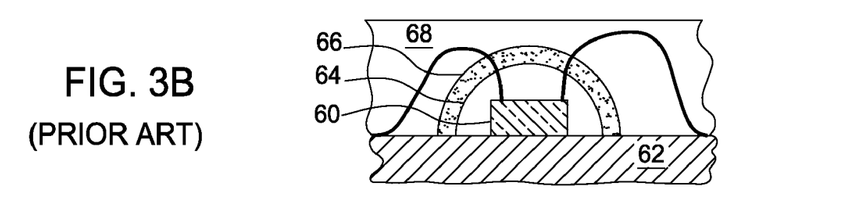

As another example, U.S. Pat. No. 5,959,316 to Lowery, issued Sep. 28, 1999 and entitled "Multiple Encapsulation of Phosphor-LED Devices," teaches an LED 18 held in a lead frame 12, as shown in FIG. 3A. A transparent spacer 50 encapsulates the LED 18, and a level of fluorescent material 52 is disposed above the transparent spacer 50. In another embodiment as illustrated in FIG. 3B, a surface-mounted LED light 60 is disposed on a device substrate 62 of a surface mount device. The LED 60 is encapsulated in a transparent spacer 64 which is further covered by a layer of fluorescent material 66 and a final transparent encapsulation layer 68. In both embodiments, the transparent spacer separates the LED from the fluorescent material in an effort to generate more uniform lighting of the fluorescent material to provide a constant, uniform white light LED. Although the yellow color ring problem may be reduced, the corresponding emission spectrum may not approach that of white light with a much broader band of emitted wavelengths. Thus, the quality of the emitted light may be poor, with a corresponding low color rendering index (CRI).

Accordingly, what is needed is a solid state device capable of producing uniform white light with a broad emission spectrum, preferably with a high CRI and without any noticeable color rings.

SUMMARY OF THE INVENTION

One embodiment of the present invention provides a light-emitting diode (LED) device for emitting uniform white light. The LED device generally includes an LED die configured to emit light having a peak wavelength less than 500 nm; a first wavelength-converting layer disposed above the LED die and containing a first fluorescent material having an emission spectrum with a peak wavelength between 600 nm and 700 nm; a second wavelength-converting layer disposed above the first wavelength-converting layer and containing a second fluorescent material having an emission spectrum with a peak wavelength between 500 nm and 600 nm; and a light-scattering layer disposed above the second wavelength-converting layer and configured to mix light emitted by the LED die and the first and second wavelength-converting layers to produce the white light with a broad emission spectrum.

Another embodiment of the present invention provides an LED device for emitting uniform white light. The LED device generally includes a vertical LED (VLED) die having a p-GaN layer, an active layer disposed above the p-GaN layer for emitting light, and an n-GaN layer disposed above the active layer. The LED device generally also includes a first wavelength-converting layer disposed above the n-GaN layer of the VLED die and containing a first fluorescent material having an emission spectrum with a peak wavelength between 600 nm and 700 nm; a second wavelength-converting layer disposed above the first wavelength-converting layer and containing a second fluorescent material having an emission spectrum with a peak wavelength between 500 nm and 600 nm; and a light-scattering layer disposed above the second wavelength-converting layer and configured to mix light emitted by the VLED die and the first and second wavelength-converting layers to produce the white light with a broad emission spectrum.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a light-emitting diode (LED) device which can produce a uniform white light with a broad emission spectrum and a high color rendering index (CRI). For example, the emission spectrum of LED devices as described herein may provide more red light and yield a higher CRI light when compared to conventional white LEDs. For some embodiments, the various lights emitted from different layers of the LED device may mix at a light-scattering encapsulation layer and become a uniform white light.

The CRI is a measure of the ability of a light source to reproduce the colors of various objects being lit by the source. Devised by the International Commission on Illumination (Commission Internationale de l'Eclairage, or CIE), the CRI provides a quantitatively measurable index, rather than a subjective one. An illumination source may have a CRI ranging from 0 to 100, with 100 being the best possible rendition of colors and 0 being the very poorest rendition. To determine the CRI, a reference source, such as a blackbody radiator, is defined as having a CRI of 100, and a test illumination source with the same color temperature is compared against the reference. The reference and the test source may be used to illuminate eight standard samples. The perceived colors under both sources as measured in the CIE 1931 color space are compared using a standard formula, and the results are averaged to get the final calculated CRI.

An Exemplary White Light LED Device

Figure 4:
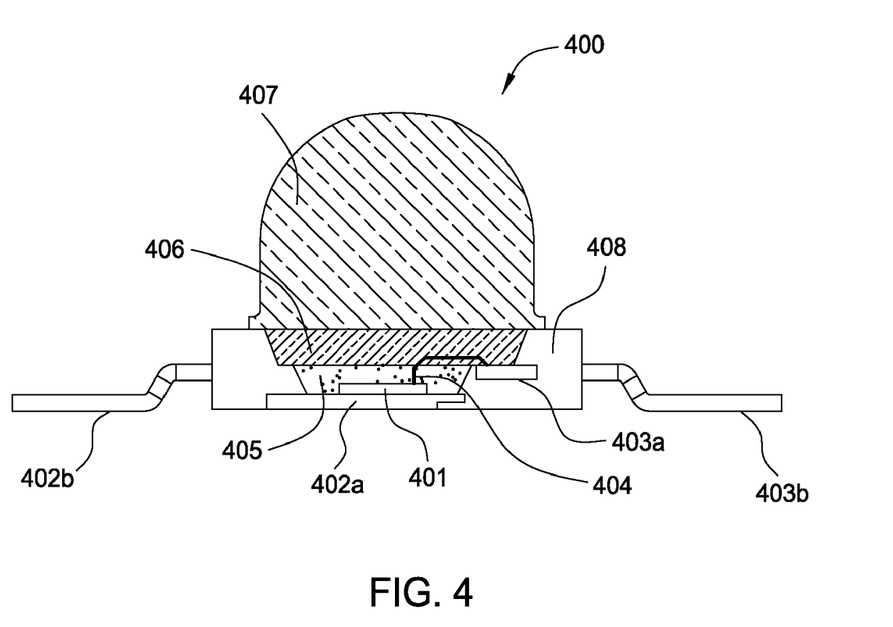
FIG. 4 is a cross-sectional diagram of an LED device having three encapsulation layers (a red-orange fluorescent layer, a yellow-green fluorescent layer, and a light-scattering layer) disposed above a blue LED die in accordance with an embodiment of the invention.

FIG. 4 is a cross-sectional diagram of an LED device 400 for producing uniform white light with a high CRI. In the LED device 400, an LED die 401 may be coupled to a lead frame 402, 403 via any suitable technique, such as bonding (e.g., with epoxy) or soldering, particularly in embodiments where the LED die 401 comprises a metal substrate. The LED die 401 may comprise a multiple quantum well (MQW) active layer for emitting light having a peak wavelength below 500 nm (i.e., blue to ultraviolet light) disposed between a p-doped layer and an n-doped layer. The p-doped, n-doped, or active layer may be composed of group III-group V semiconductor compounds, such as $Al_xGa_yIn_{1-x-y}N$, where $x \leq 1$ and $y \leq 1$. To emit blue light, for example, the LED die 401 may comprise a p-GaN layer and an n-GaN layer.

For some embodiments, the LED die 401 may be a vertical LED (VLED) die, as shown in FIG. 4, where connections (e.g., electrodes) for the p-doped layer and the n-doped layer are on opposite surfaces of the LED die. In such embodiments, the p-doped layer may be electrically and thermally coupled to an internal portion 402a of a first lead 402, where an external portion 402b of the first lead 402 extends from a housing 408 for external connection. The n-doped layer of the LED die 401 may be coupled to an internal portion 403a of a second lead 403 via a bonding wire 404. The bonding wire 404 may be fabricated from any suitable electrically conductive material, such as gold. An external portion 403b of the second lead 403 may extend from the housing 408 for external connection.

For other embodiments, the LED die 401 may be a traditional LED die, where connections (e.g., electrodes) for both the p-doped layer and the n-doped layer are on an upper surface of the LED die. In such embodiments, the n-doped layer may be electrically coupled to the internal portion 403a of the second lead 403 via the bonding wire 404, and the p-doped layer may be electrically coupled to the internal portion 402a of the first lead 402 via another bonding wire (not shown).

The housing 408 may be composed of any suitable electrically insulative material, such as plastic, resin, or ceramic. The internal portion 402a of the first lead 402 may be substantially exposed through a bottom portion of the housing 408 in an effort to dissipate heat via thermal conduction from the LED die 400 to a mounting surface, such as a printed circuit board (PCB). The housing may provide a recessed volume (i.e., a cavity) in which the LED die 401 may be disposed. The shape of the recessed volume may be conical, pyramidal, cuboidal, or cylindrical. For some embodiments where the lateral surfaces of the recessed volume are sloped, the sloped surfaces may be coated with a reflective material in an effort to increase light extraction from the LED device 400.

A first wavelength-converting layer 405 may be disposed above and, in some embodiments, encapsulate the LED die 401. The first wavelength-converting layer 405 may comprise a transparent resin, which may contain a fluorescent material. The fluorescent material in the first wavelength-converting layer 405 may emit light having a peak wavelength between about 600 nm and 700 nm. With orange light occupying wavelengths from about 590 to 625 nm and red light occupying wavelengths from about 625 to 740 nm, the purpose of the first wavelength-converting layer 405 may be to emit a substantially red light when light from the forward-biased LED stimulates the fluorescent material contained therein. The fluorescent material may be any suitable material for emitting red light when blue to ultraviolet light is absorbed, such as CaS:Eu, SrS:Eu, and an alkaline earth silicon nitride doped with Eu (europium). Although a portion of the blue to ultraviolet light emitted by the LED die 401 may be absorbed by the fluorescent material in the first wavelength-converting layer 405 to produce red light, another portion of the blue to ultraviolet light may traverse the first wavelength-converting layer 405.

Above the first wavelength-converting layer 405, a second wavelength-converting layer 406 may be disposed. The second wavelength-converting layer 406 may fill a remaining portion of the recessed volume of the housing 408 for some embodiments, as shown in FIG. 4. The second wavelength-converting layer 406 may also comprise a transparent resin, which may contain a fluorescent material, most likely different from the fluorescent material of the first wavelength-converting layer 405. The fluorescent material in the second wavelength-converting layer 406 may emit light having a peak wavelength between about 500 nm and 600 nm. For some embodiments, this fluorescent material may be stimulated by blue to ultraviolet light emitted by the LED die 401 to emit light in a range from substantially green (wavelengths between about 500 to 565 nm) to substantially yellow (wavelengths between about 565 to 590 nm). The fluorescent material may be any suitable material for emitting yellow to green light when blue to ultraviolet light is absorbed, such as YAG:Ce, calcium scandate doped with Ce (cerium), an alkaline earth silicon nitride doped with Ce or Eu, and an alkaline earth silicate doped with Eu.

Although a portion of the blue to ultraviolet light emitted by the LED die 401 and reaching the second wavelength-converting layer 406 may be absorbed by the fluorescent material contained therein to produce light ranging from yellow to green, another portion of the blue to ultraviolet light may traverse the second wavelength-converting layer 406. The substantially red light from the first wavelength-converting layer 405 may also traverse the second wavelength-converting layer 406.

For some embodiments, the second wavelength-converting layer 406 may comprise more than one fluorescent material. For example, the second-wavelength-converting layer 406 may comprise one fluorescent material to emit substantially green light (wavelengths between about 500 to 565 nm) and another fluorescent material to emit substantially yellow light (wavelengths between about 565 to 590 nm). The emission spectrums between the two fluorescent materials should be different. With two fluorescent materials in the second wavelength-converting layer 406, there are more variables to adjust and, hence, a greater degree of freedom in adjusting the proportions of the fluorescent materials to achieve a desired emission spectrum approaching that of ideal white light.

A light-scattering layer 407 may be disposed above the second wavelength-converting layer 406 and the housing 408. For some embodiments, the light-scattering layer 407 may be dome-shaped as illustrated in FIG. 4, but may be any suitable shape for emitting light from the LED device 400. The light-scattering layer 407 may comprise a transparent resin and any suitable material for scattering and mixing light in an effort to produce uniform white light from the blue to ultraviolet light emitted by the LED die 401, the substantially red light emitted by the first wavelength-converting layer 405, and the yellow to green light emitted by the second wavelength-converting layer 406. Suitable light-scattering material may include, for example, ceramic, $TiO_2$, $Al_2O_3$, or $SiO_2$. The average size of a particle of light-scattering material composing the light-scattering layer 407 may be smaller than 100 nm or, more preferably, smaller than 50 nm or even 30 nm. Smaller particles may lead to increased light scattering. For some embodiments, the weight ratio of light-scattering material to transparent resin may be smaller than 0.05.

Figure 5:
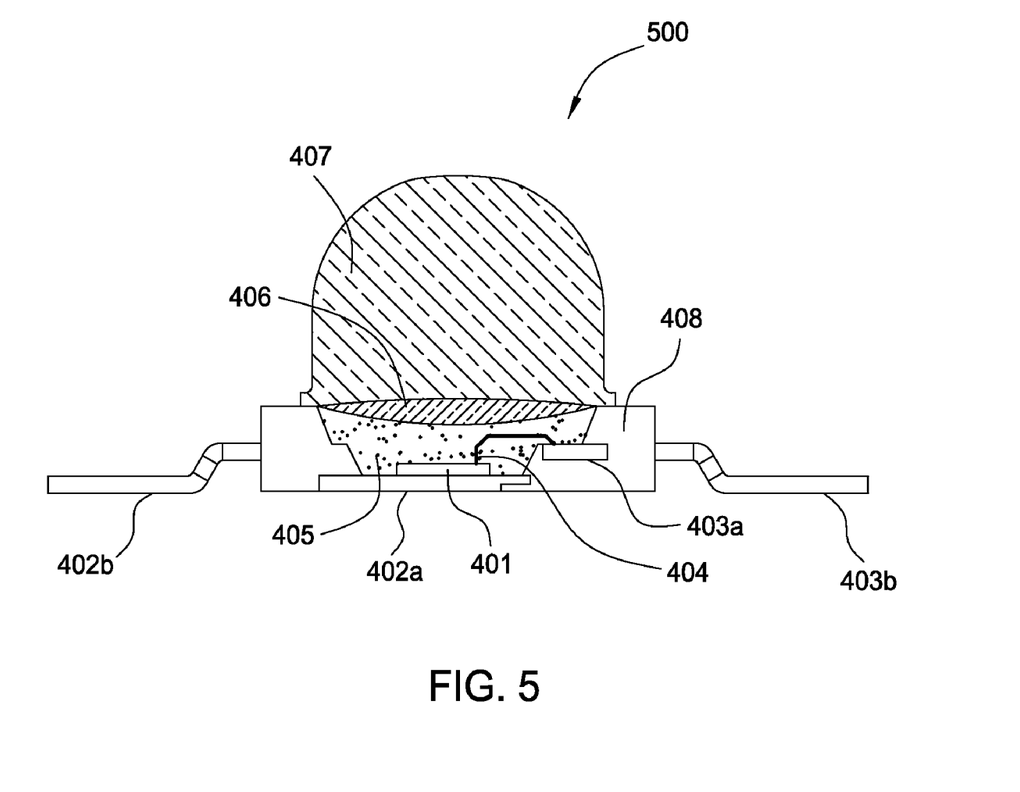
FIG. 5 is a cross-sectional diagram of an LED device having three encapsulation layers (a red-orange fluorescent material, a yellow-green fluorescent material, and a light-scattering material) disposed above a blue LED die, where the second layer has a non-uniform thickness in accordance with an embodiment of the invention.

As illustrated in FIG. 4, the upper surfaces of both the first and second wavelength-converting layers 405, 406 may be flat. For some embodiments, however, the upper surface of the first wavelength-converting layer 405 may be convex or, as shown in the LED device 500 of FIG. 5, concave. Likewise, the upper surface of the second wavelength-converting layer 406 may be concave or convex, as depicted in FIG. 5. Employing wavelength-converting layers 405, 406 with concave or convex surfaces (i.e., a non-uniform thickness) may permit the emitted light from and light traversing a particular wavelength-converting layer to be focused in a higher layer.

Figure 2:
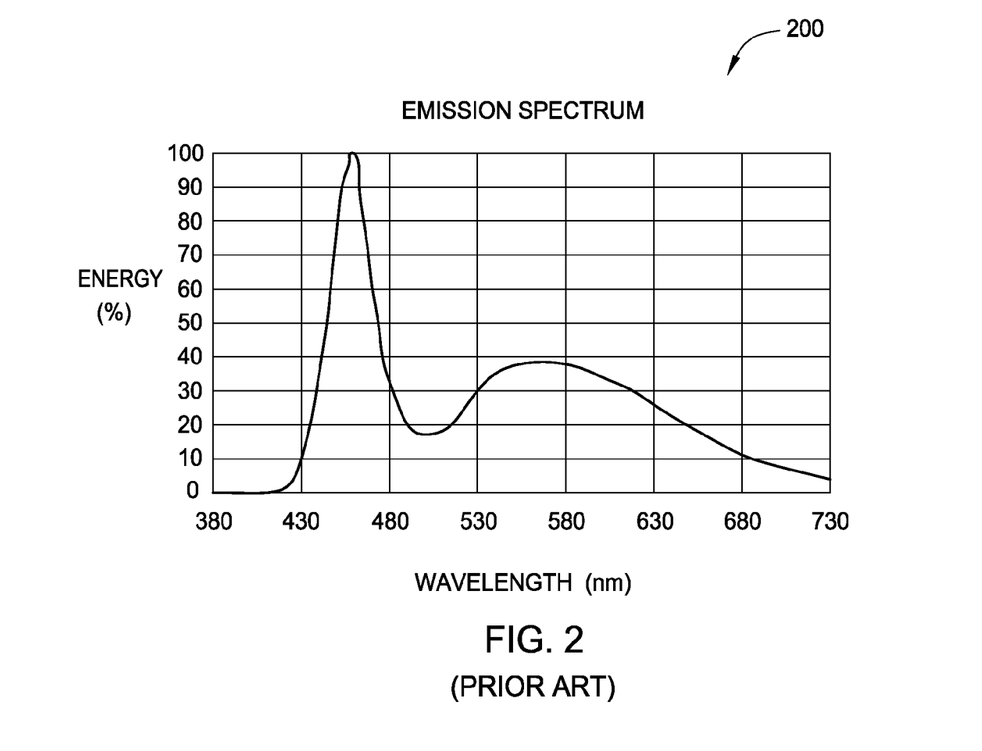
FIG. 2 is a prior art emission spectrum for the LED device of FIG. 1.

Advantages of white light LED devices 400, 500 as described above may be seen in FIGS. 6A-8B, especially when compared to FIG. 2. Overall, the white light LED devices 400, 500 provide more red light and yield a higher CRI when compared to conventional white light LED devices. By providing blue to ultraviolet light from the LED die 401, substantially red light from the first wavelength-converting layer 405, and yellow to green light from the second wavelength-converting layer 406 and by incorporating a light-scattering layer in an effort to mix the light emissions from the layers below, a uniform white light having a broad emission spectrum may be produced.

Figure 6A:
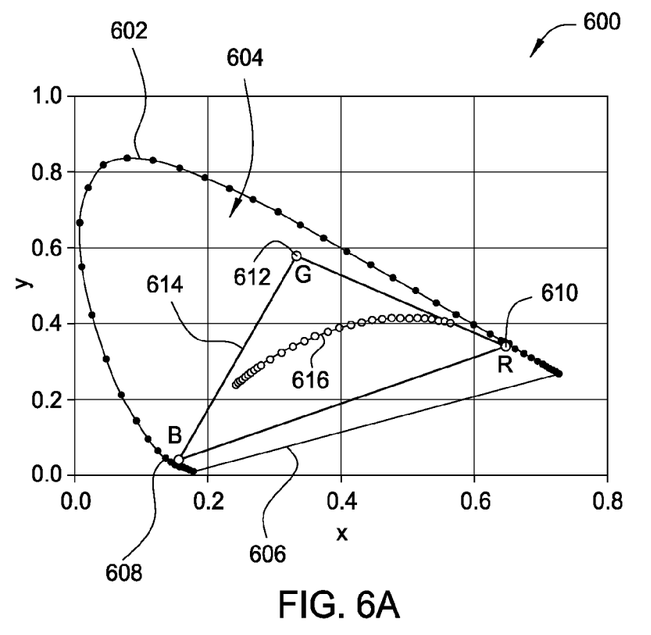
FIGS. 6A and 6B are an International Commission on Illumination (Commission Internationale de l'Eclairage, or CIE) chromaticity diagram and an emission spectrum, respectively, corresponding to an LED device having a red fluorescent material in the first encapsulation layer disposed above the blue LED die and a substantially green fluorescent material in the second encapsulation layer in accordance with an embodiment of the invention.
Figure 6B:
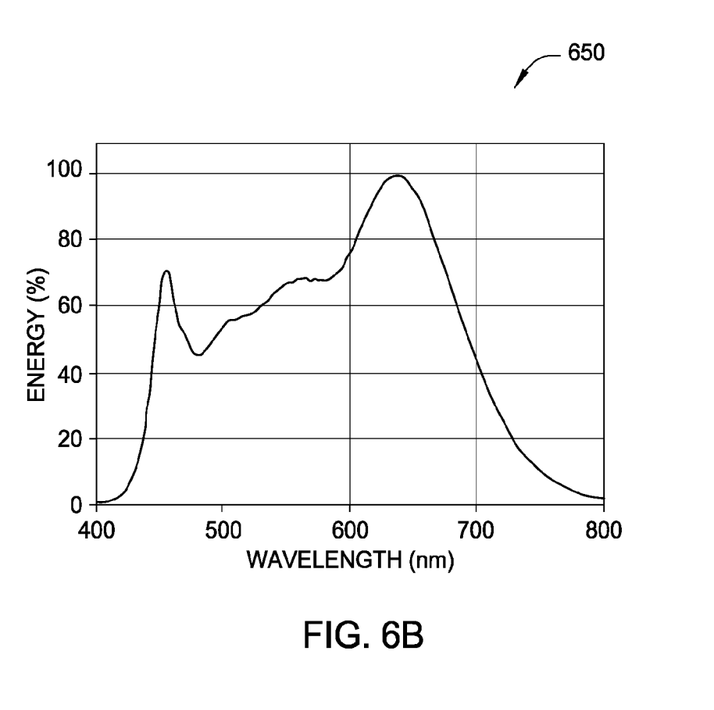

FIGS. 6A and 6B are a CIE chromaticity diagram 600 and an emission spectrum 650, respectively, corresponding to an LED device having a substantially red fluorescent material in the first wavelength-converting layer 405 disposed above a blue LED die and a substantially green fluorescent material in the second wavelength-converting layer 406 in accordance with an embodiment of the invention.

In the CIE chromaticity diagram 600, the relations among tristimulus values X, Y, and Z are illustrated independently of luminance. In this two-dimensional chart, y is by convention plotted as a function of x, where $y=Y/(X+Y+Z)$ and $x=X/(X+Y+Z)$. The continuous locus of spectrum colors is represented by the outermost contour 602. All non-spectral colors are contained within an area 604 defined by the outermost contour 602 and a straight line 606 running from red to violet.

According to the embodiment of the LED device associated with FIG. 6A, the area for the emitted blue light from the LED die 401 is plotted at point B 608, the area for the emitted red light is plotted at point R 610, and the area for the emitted green light is plotted at point G 612. One property of a chromaticity diagram is that additive mixtures of colors plot along straight lines connecting the chromaticities of the colors being mixed. A triangle 614 is formed by connecting points B 608, R 610, and G 612 together with straight lines, and this triangle nearly surrounds the plot 616 of a blackbody radiator having a color temperature ranging from 2500 K to 8000 K. The most neutral white point may be considered as 6500 K or x=0.3127/y=0.3290 on the chromaticity diagram. By adjusting the proportions of the red and green fluorescent materials in the first and second wavelength-converting layers, respectively, any color within the triangle 614 may be theoretically produced.

Referring now to FIG. 6B, the emission spectrum 650 of this embodiment of a white light LED device is decidedly broader than the emission spectrum 200 of FIG. 2. In FIG. 2, the energy above 40% was in a narrow wavelength band ranging from about 440 nm to 475 nm (i.e., blue light), and two separate peaks can be distinguished as described above. In contrast, the emission spectrum 650 of FIG. 6B demonstrates that a much broader wavelength band with energy above 40% ranging from about 450 nm to 710 nm, encompassing light ranging from blue to red with the maximum energy being emitted at red wavelengths. Such a broad emission spectrum 650 approaches the ideal spectrum of white light much closer than conventional white light LED devices, such as the emission spectrum 200 of FIG. 2, and lead to a high CRI.

Figure 7A:
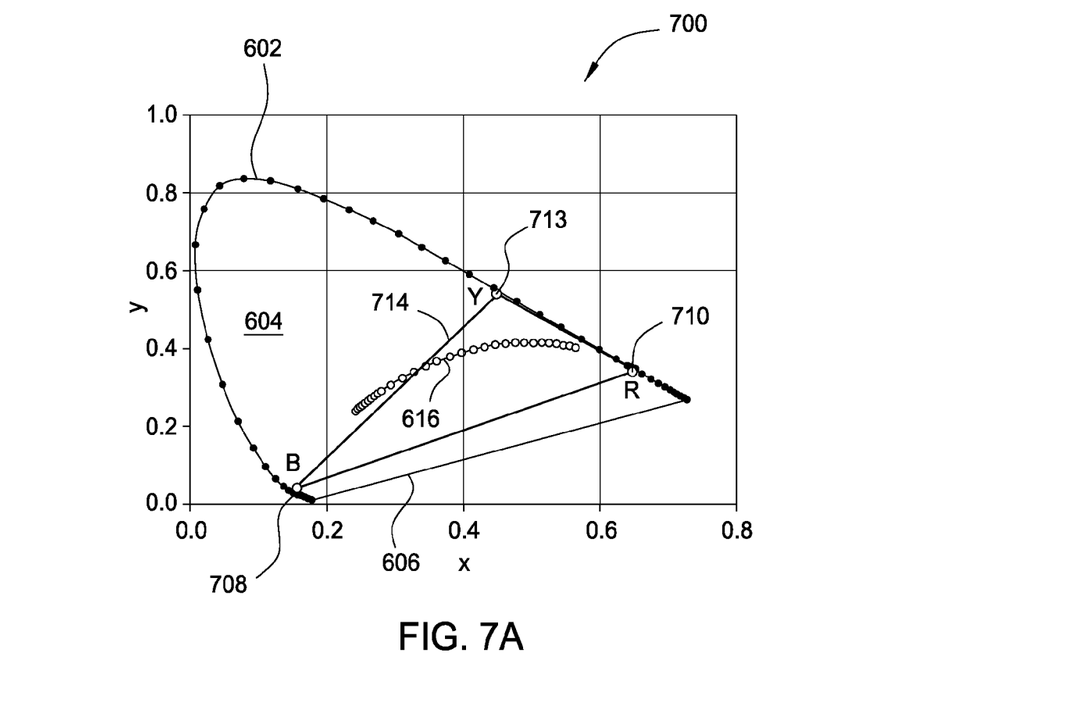
FIGS. 7A and 7B are a CIE chromaticity diagram and an emission spectrum, respectively, corresponding to an LED device having a red fluorescent material in the first encapsulation layer disposed above the blue LED die and a substantially yellow fluorescent material in the second encapsulation layer in accordance with an embodiment of the invention.
Figure 7B:
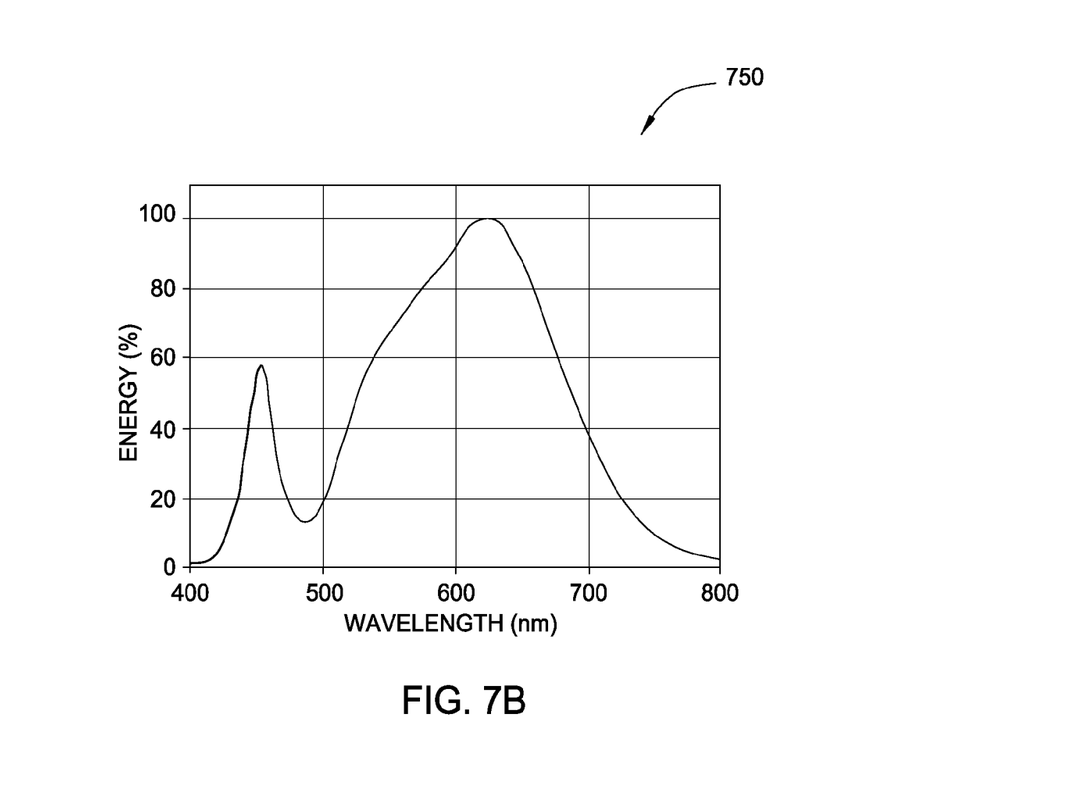

FIGS. 7A and 7B are a CIE chromaticity diagram 700 and an emission spectrum 750, respectively, corresponding to an LED device having a substantially red fluorescent material in the first wavelength-converting layer 405 disposed above a blue LED die and a substantially yellow fluorescent material in the second wavelength-converting layer 406 in accordance with an embodiment of the invention. According to this embodiment, the area for the emitted blue light from the LED die 401 is plotted at point B 708, the area for the emitted red light is plotted at point R 710, and the area for the emitted yellow light is plotted at point Y 713. A triangle 714 is formed by connecting points B 708, R 710, and Y 713 together with straight lines, portraying the potential range of colors that may be theoretically produced by adjusting the proportions of the red and yellow fluorescent materials in the first and second wavelength-converting layers, respectively.

The emission spectrum 750 of FIG. 7B is also broader and has substantially more red light than the emission spectrum 200 of FIG. 2, although not as broad as the emission spectrum 650 of FIG. 6B. In FIG. 7B, the emission spectrum 750 illustrates a small wavelength band ranging from about 445 nm to 460 nm (i.e., blue light) and a much broader wavelength band ranging from about 520 nm to 695 nm with energy above 40%, encompassing light ranging from green to red with the maximum energy being emitted at red wavelengths.

Figure 8A:
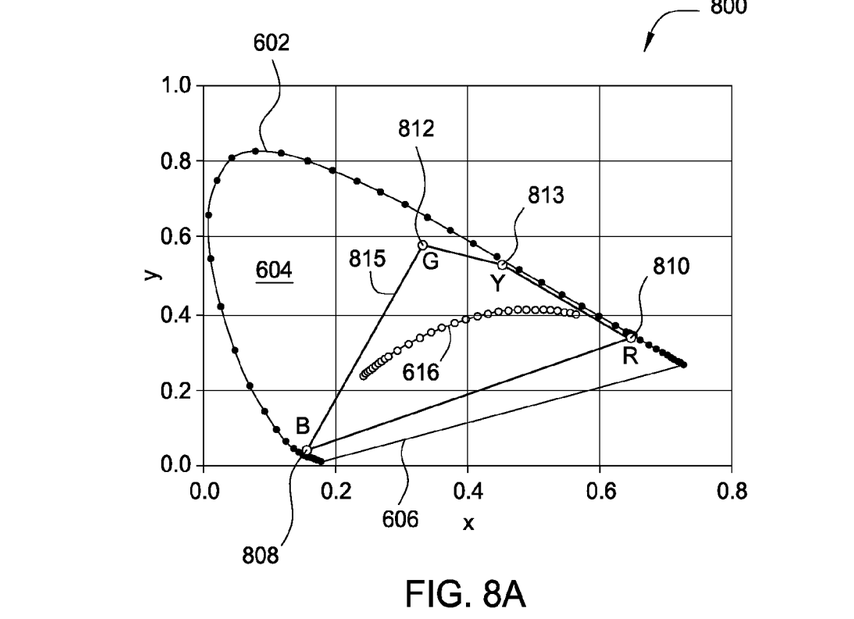
FIGS. 8A and 8B are a CIE chromaticity diagram and an emission spectrum, respectively, corresponding to an LED device having a red fluorescent material in the first encapsulation layer disposed above the blue LED die and a yellow-green fluorescent material in the second encapsulation layer accordance with an embodiment of the invention.
Figure 8B:
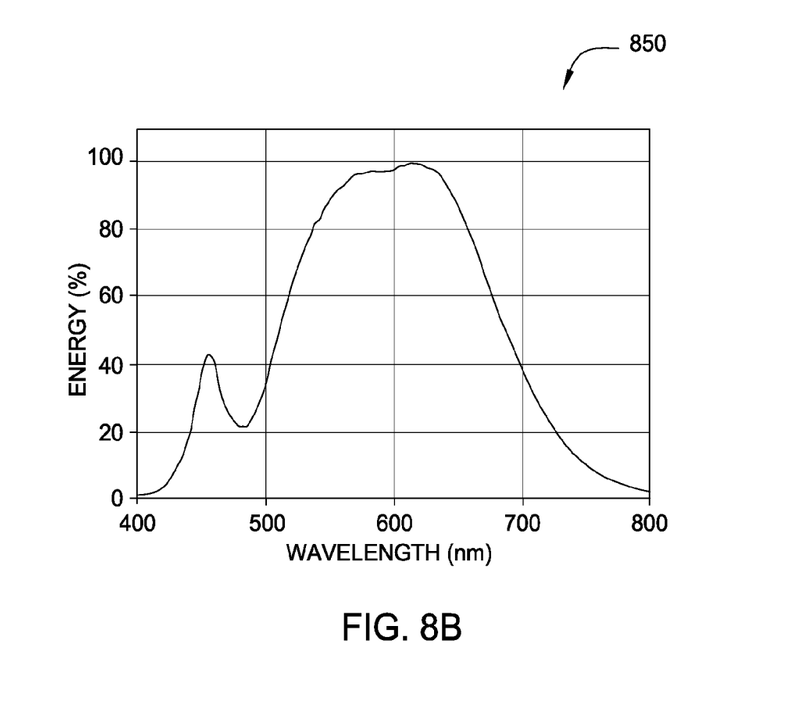

FIGS. 8A and 8B are a CIE chromaticity diagram 800 and an emission spectrum 850, respectively, corresponding to an LED device having a substantially red fluorescent material in the first wavelength-converting layer 405 disposed above a blue LED die and a substantially yellow fluorescent material and a substantially green fluorescent material in the second wavelength-converting layer 406 in accordance with an embodiment of the invention. According to this embodiment, the area for the emitted blue light from the LED die 401 is plotted at point B 808, the area for the emitted red light is plotted at point R 810, the area for the emitted green light is plotted at point G 812, and the area for the emitted yellow light is plotted at point Y 813. A four-sided polygon 815 is formed by connecting points B 808, R 810, G 812, and Y 813 together with straight lines, portraying the potential range of colors that may be theoretically produced by adjusting the proportions of the red, green, and yellow fluorescent materials in the first and second wavelength-converting layers 405, 406.

The emission spectrum 850 of FIG. 8B is not only broader than the emission spectrum 200 of FIG. 2, but also has the flattest wavelength band out of all the emission spectrums 200, 650, 750 described above. In FIG. 8B, the emission spectrum 850 illustrates a broad wavelength band with energy above 40% ranging from about 505 nm to 695 nm, encompassing light ranging from green to red with near maximum energy being emitted at yellow, orange, and red wavelengths.

Figure 9:
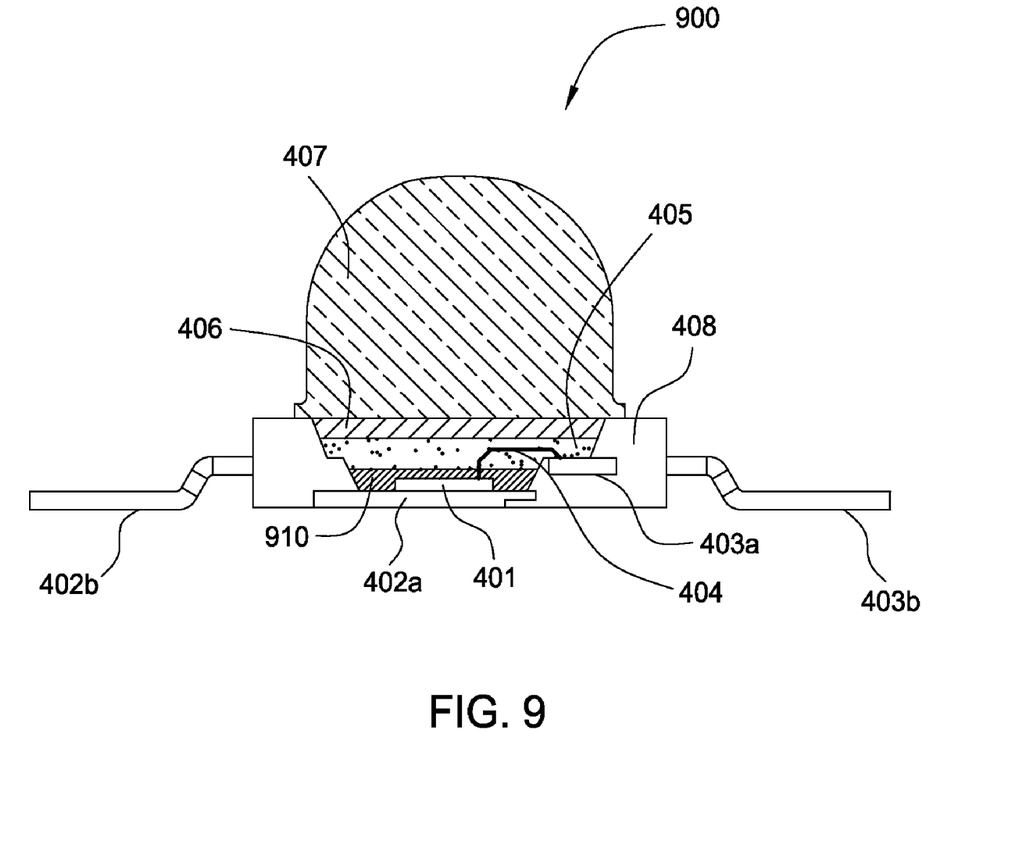
FIG. 9 is a cross-sectional schematic diagram of an LED device having four encapsulation layers (a transparent layer, a red-orange fluorescent layer, a yellow-green fluorescent layer, and a light-scattering layer) disposed above a blue LED die in accordance with an embodiment of the invention.

Referring now to FIG. 9, a cross-sectional schematic diagram of an LED device 900 is illustrated. The LED device 900 may be similar to the LED device 400 of FIG. 4 with the addition of a transparent layer 910 interposed between the LED die 401 and the first wavelength-converting layer 405. Encapsulating the LED die 401, the transparent layer 910 may comprise any suitable optically transparent material, such as a transparent resin, and may most likely not contain any fluorescent material. The transparent layer 910 may have a uniform thickness in an effort to promote a more uniform white light being emitted from the LED device 900. The upper surface of the transparent layer 910 may be flat, as illustrated in FIG. 9, convex, or concave. For some embodiments, the transparent layer 910 may be shaped as a dome.

While the foregoing is directed to embodiments of the present invention, other and further embodiments of the invention may be devised without departing from the basic scope thereof, and the scope thereof is determined by the claims that follow.

The invention claimed is:

1. A light-emitting diode (LED) device for emitting uniform white light, comprising:
   an LED die configured to emit light having a peak wavelength less than 500 nm;
   a first wavelength-converting layer disposed above the LED die and containing a first fluorescent material having an emission spectrum with a peak wavelength between 600 nm and 700 nm;
   a second wavelength-converting layer disposed above the first wavelength-converting layer and containing a second fluorescent material having an emission spectrum with a peak wavelength between 500 nm and 600 nm; and
   a light-scattering layer disposed above the second wavelength-converting layer and configured to mix light emitted by the LED die and the first and second wavelength-converting layers to produce the white light with a broad emission spectrum.

2. The LED device of claim 1, wherein the first or the second wavelength-converting layer comprises a transparent resin.

3. The LED device of claim 1, wherein the first fluorescent material comprises at least one of CaS:Eu and SrS:Eu.

4. The LED device of claim 1, wherein the first fluorescent material comprises an alkaline earth silicon nitride doped with Eu.

5. The LED device of claim 1, wherein the second fluorescent material comprises at least one of YAG:Ce and calcium scandate doped with Ce.

6. The LED device of claim 1, wherein the second fluorescent material comprises at least one of an alkaline earth silicate doped with Eu and an alkaline earth silicon nitride doped with Ce or Eu.

7. The LED device of claim 1, wherein the light-scattering layer is shaped as a dome.

8. The LED device of claim 1, wherein the light-scattering layer comprises a transparent resin and a light-scattering material.

9. The LED device of claim 8, wherein the light-scattering material comprises at least one of ceramic, $TiO_2$, $Al_2O_3$, or $SiO_2$.

10. The LED device of claim 8, wherein an average particle size of the light-scattering material is smaller than 100 nm.

11. The LED device of claim 8, wherein an average particle size of the light-scattering material is smaller than 30 nm.

12. The LED device of claim 8, wherein a weight ratio of the light-scattering material to the transparent resin is smaller than 0.05.

13. The LED device of claim 1, wherein a thickness of the second wavelength-converting layer is non-uniform.

14. The LED device of claim 13, wherein a surface of the second wavelength-converting layer adjacent the light-scattering layer is convex.

15. The LED device of claim 1, wherein a surface of the first wavelength-converting layer adjacent the second wavelength-converting layer is concave.

16. The LED device of claim 1, further comprising a transparent layer interposed between the LED die and the first wavelength-converting layer.

17. The LED device of claim 1, wherein the second wavelength-converting layer comprises a third fluorescent material having an emission spectrum with a peak wavelength between 500 nm and 600 nm, different from the emission spectrum of the second fluorescent material.

18. A light-emitting diode (LED) device for emitting uniform white light, comprising:
- a vertical LED (VLED) die, comprising:
  - a p-GaN layer;
  - an active layer disposed above the p-GaN layer for emitting light; and
  - an n-GaN layer disposed above the active layer;
- a first wavelength-converting layer disposed above the n-GaN layer of the VLED die and containing a first fluorescent material having an emission spectrum with a peak wavelength between 600 nm and 700 nm;
- a second wavelength-converting layer disposed above the first wavelength-converting layer and containing a second fluorescent material having an emission spectrum with a peak wavelength between 500 nm and 600 nm; and
- a light-scattering layer disposed above the second wavelength-converting layer and configured to mix light emitted by the VLED die and the first and second wavelength-converting layers to produce the white light with a broad emission spectrum.

19. The LED device of claim 18, wherein the second wavelength-converting layer comprises a third fluorescent material having an emission spectrum with a peak wavelength between 500 nm and 600 nm, different from the emission spectrum of the second fluorescent material.

20. The LED device of claim 18, wherein the light-scattering layer comprises a transparent resin and a light-scattering material and an average particle size of the light-scattering material is smaller than 100 nm.

* * * * *